United States Patent [19]

Walters

[11] Patent Number: 5,005,018
[45] Date of Patent: Apr. 2, 1991

[54] (U) MODULATOR TO PROVIDE A CONTINUOUS STEPPED FREQUENCY SIGNAL FORMAT

[75] Inventor: Glenn A. Walters, Escondido, Calif.

[73] Assignee: The United States of America as represented by the Secretary of the Navy, Washington, DC

[21] Appl. No.: 440,392

[22] Filed: Oct. 6, 1982

[51] Int. Cl.$^5$ .......................... G01S 13/00; H03C 3/12
[52] U.S. Cl. ..................................... 342/203; 307/320; 332/107; 332/108; 342/202; 375/45; 375/48; 375/62; 375/71
[58] Field of Search ........................ 331/76, 77, 36 R; 332/29 R, 29 M, 30 R, 30 V, 107, 108; 375/45, 48, 62, 71; 343/5 HM, 17.2 R; 307/320; 342/202, 203

[56] References Cited

U.S. PATENT DOCUMENTS

| | | | |
|---|---|---|---|
| 3,110,004 | 11/1963 | Pope | 334/15 |
| 3,119,079 | 1/1964 | Keizer | 332/47 |
| 3,267,467 | 8/1966 | Gerardin et al. | 343/17.2 R |
| 3,281,648 | 10/1966 | Collins | 321/69 |
| 3,440,569 | 4/1969 | Hutchison | 332/30 V |
| 3,500,265 | 3/1970 | Klettke | 334/15 |
| 3,533,020 | 10/1970 | Hecht | 333/17 R |
| 3,538,352 | 11/1970 | Nishizawa | 307/265 |
| 3,600,706 | 8/1971 | Ritchie | 331/177 V |

Primary Examiner—Stephen C. Buczinski
Attorney, Agent, or Firm—Harvey Fendelman; Thomas Glenn Keough

[57] ABSTRACT

A modulator provides a continuous signal format composed of discrete frequency steps and is designed to eliminate frequency overlap or smearing normally associated with filter ringing.

2 Claims, 2 Drawing Sheets (U) MODULATOR TO PROVIDE A CONTINUOUS STEPPED FREQUENCY SIGNAL FORMAT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

An evolving new generic type of radar architecture referred to as "CFMR", (Coherent Frequency Multiplexed Radar), has a continuous stepped frequency waveform transmitted that is composed of a contiguous series of frequency segmented signals. A well defined, single frequency signal is provided for a given period of time and then a second signal at a different frequency is switched with minimal change in amplitude and without the coexistance of both frequencies at any time. This process is continuous and may involve numerous signal frequency segments of differing frequency in any desired sequence for varying periods of time.

The early development CFMR systems utilized electronically-controlled RF switches and filter banks. The modulator implementation included and electronically-controlled tuneable filter whose purpose is to pass a selected frequency for a required period of time and then, through electronic control, switch to a second selected frequency. Effects of filter ringing were minimized by utilizing Bessel type filters and maintaining a matched condition of all filters in both their "on" and "off" condition. A requisite was to eliminate ringing; i.e., the continued transmission of energy stored within the filter at its first frequency during the transmission of energy at the following frequency. The period of transmission for a single frequency, or band frequencies, the number of frequency segments transmitted and the total bandwidth of operation of the tuneable filter were all matters of design choice.

For example, in a typical CFMR application, a group of 16 harmonically related frequencies are sequentially transmitted in a continuous manner. The signal amplitude was constant and the duty cycle approached 100%. The mode of operation requires reception of weak signal returns while transmitting signals of many orders of magnitude higher power. Signal separation is accomplished through frequency multiplexing; however, a multiplicity of problems arise when the ringdown signals from filters within the transmitter circuits mix with signals then being transmitted or received. Thus, a continuing need in the state of the art is to provide a modulator that assures a continuous stepped frequency signal format with improved performance, a significant reduction in circuit requirements and an improved operating efficiency.

SUMMARY OF THE INVENTION

A modulator for providing a continuous stepped frequency signal format has the capability of selectively transmitting specific frequency bands of interest for a given period of time and, through an electronically controlled switch, changes its output to a second selected frequency band after switching from a given frequency band. During the post-transmission period, ringing is not incurred; i.e., the continued transmission of energies stored within the filter at its first frequency during the transmission of energy at the following frequency does not occur because the energy so stored is converted to the new frequency band. The period of transmission for a single frequency or band of frequencies, the number of frequency segments transmitted and the total bandwidth of operation are all matters of design choice.

Filters are composed of reactive elements, inductances and capacitances, whose characteristics are chosen so as to pass, with minimum attenuation, signals at certain frequencies and to highly attenuate signals at unwanted frequencies. They are tuned to a given frequency characteristic and impedance level through the appropriate choice of values for the inductances and capacitances. They can be configured to act as bandpass, band reject, high pass and low pass filters.

Two mutually coupled parallel resonant circuits function as a bandpass filter and have an input signal coupled into one of the parallel resonant circuits with an output signal loop coupled from the other parallel circuits. The values of inductance and capacitance are chosen to be resonant at the bandpass frequency of interest so that a signal at the resonant frequency of the filter is passed with minimum attenuation. Switching value of inductance or capacitance to resonate at a second frequency band rejects the first frequency signal and the energy stored within the filter is converted to a signal at a frequency corresponding to the new resonant frequency of the filter. Simultaneously inputting the filter with signals at both frequencies, switches the output signal from the first to the second frequency. The energy stored within the filter at the instant of switching is converted to the frequency of the second signal and no ringing effects are observed. The switching time relates to the speed in which the capacitance or inductance of the reactive element can be changed from one value to a second value.

Tuning varactors have been developed which have exceptionally high "Q"s and excellent capacity change ratios. Typically, these devices are diodes whose capacitance/voltage relationships closely approximate square laws. They have minimum capacitance when they are highly back biased and their capacitance increases as the back bias approaches zero. Switching time from one capacitance level to another can be accomplished in nanoseconds. They are configured for operation from low RF frequencies through the conventional microwave bands.

Inductors with powdered iron or ferrite cores can be changed in their value of inductance by controlling the saturation level within the core material. The tuning range and switching time characteristics are not as favorable as experienced with varactors; however, their use does extend the total operational bandwidth of the filter and they can at times be advantageously used.

In a typical application, the bandpass filter is inputted from a harmonic generator. Voltage or currents are fed through RF chokes to the reactive elements and currents and voltage levels are selectively chosen through electronic control. The output signal from the filter is optionally a series of contiguous frequency segmented signals as may be required for formatting a pulse compression waveform or a CFMR signal.

The primary objective of this invention is to provide a new and useful switching technique to transmit a continuous frequency segment signal wherein an adjacent segmented period is operated at a different frequency and the simultaneous transmission of both frequencies during and after the transition period is virtually eliminated.

A second objective is to transfer the energy stored within the filter at its prior operating frequency into energy at the next operating frequency at the instant of switching.

Yet another objective is to provide various forms of implementation for an electronically controlled tuneable filter.

These and other objects and many advantages of this invention will become more readily apparent upon reading of the following detailed description and examination of the drawings.

DESCRIPTION OF THE PREFERRED EMBODIMENT

Figure 1:
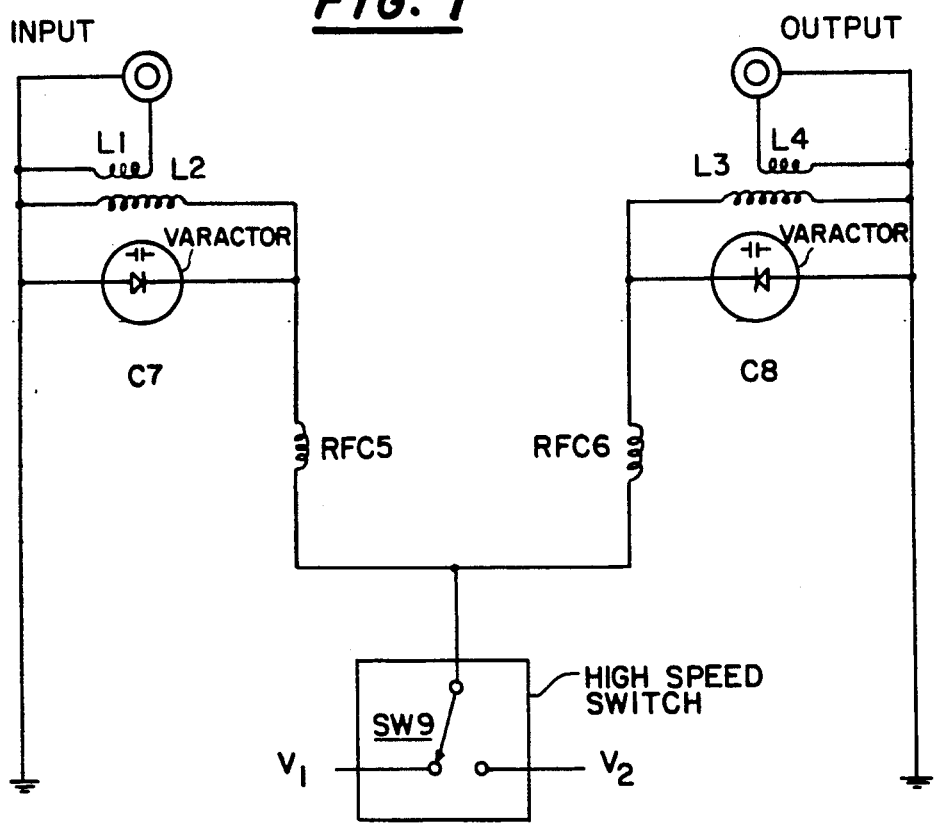
FIG. 1 shows an electronically controlled tuneable filter employing varactors.

Referring to FIG. 1 of the drawings, a simple bandpass filter is made up of two mutually coupled parallel resonant circuits. The input signal is loop-coupled through an inductor $L_1$ to an inductor $L_2$. $L_2$, in combination with a capacitor $C_7$, forms a parallel resonant circuit and represents the input section of the filter. $L_2$ is mutually coupled to an inductor $L_3$. $L_3$, in combination with a capacitor $C_8$, creates a parallel resonant circuit and represents the output section of the filter. The output signal is loop-coupled from $L_3$ through another inductor $L_4$.

Both $C_7$ and $C_8$ are varactors; i.e., voltage tuneable capacitors. $C_7$ is coupled through radio frequency choke $RFC_5$ to the moving arm of switch $SW_9$. $C_8$ is coupled through radio frequency choke $RFC_6$ in the same manner to switch $SW_9$. $SW_9$ can be switched from $V_1$ to $V_2$, which are two selected voltages of different values. In the first position, the electronically controlled tuneable filter is tuned to a first frequency of interest. In the second position, when coupled to $V_2$, it is tuned to a second frequency of interest. The switch can contain as many poles as may be required.

Figure 2:
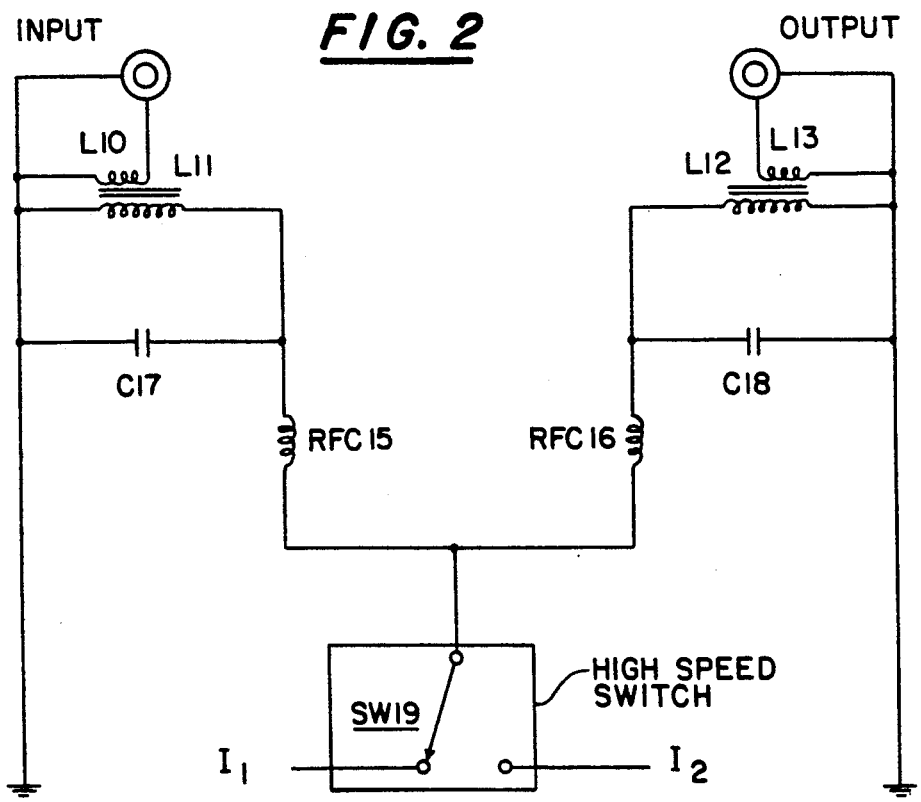
FIG. 2 is an electronically controlled tuneable filter employing inductors with ferrite cores.
Figure 3:
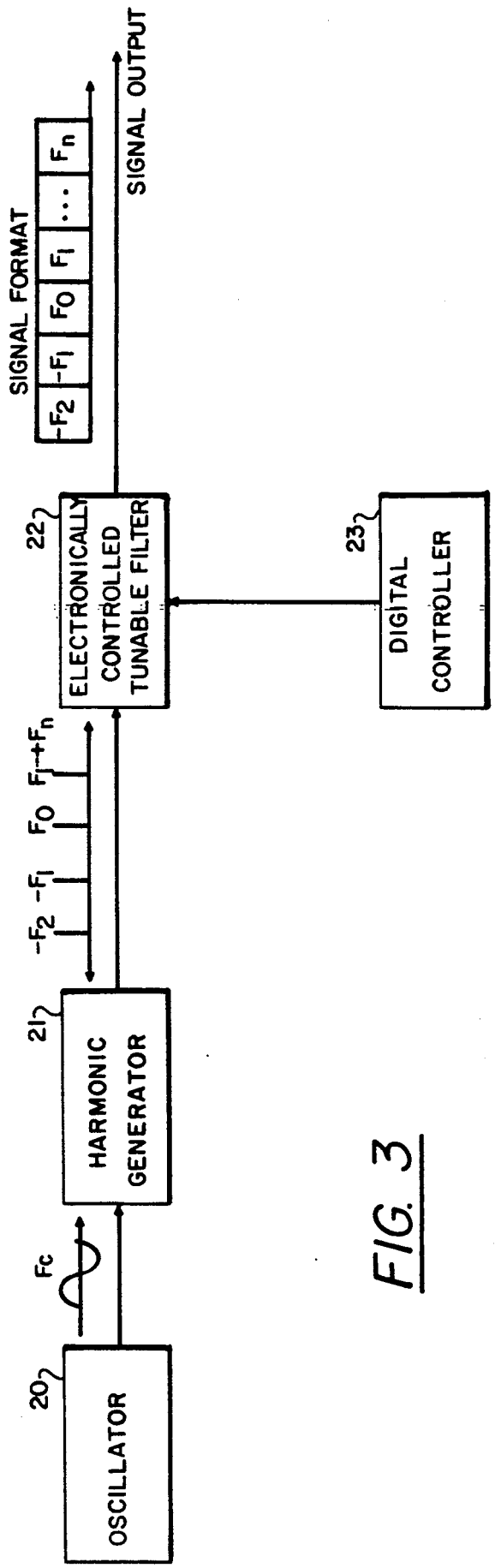
FIG. 3 depicts a block diagram employing an electronically controlled tuneable filter to provide a frequency segmented continuous waveform signal.

The circuit shown in FIG. 2 is similar to that shown in FIG. 3 and operates, in terms of its filtering action, in an identical manner. In this case, however, $C_{17}$ and $C_{18}$ are fixed capacitors whose value of capacitance is unaffected by their voltage level of operation. $L_1$ and $L_2$ contain cores whose saturation level, and therefore their inductances, are changed by a magnitizing current passing through $L_{11}$ or $L_{12}$. In this case, radio frequency choke, $RFC_{15}$ and $RFC_{16}$ are routed to switch $SW_{19}$. This switch can be switched between two current sources, $I_1$ and $I_2$, which in turn changes the resonant frequencies of the input and output circuits. Here again the number of poles used on switch $SW_{19}$ can be increased to any desired number.

The block diagram in FIG. 3 indicates the basic elements required to format a continuous wave signal composed of a contiguous group of segments operating at different frequencies. Oscillator 20 operates as a continuous wave signal at some fixed frequency $f_o$. It is inputted into a harmonic generator whose frequency spectrum consists of a series of harmonically related spikes centered around $f_o$. This multi-frequency signal is inputted into an electronically controlled tuneable filter 22 fabricated in accordance with this inventive concept. Voltage, and/or current levels are established through a digital control unit 23 and coupled to the reactive elements within the electronically controlled tuneable filter by elements corresponding to the switches $SW9$ and $SW19$. In this way, the inputted harmonically related signals can be formatted into a series of frequency segments in any desired sequence and pulse width, consistent with matched filter design concept, that may be desired.

It is readily apparent to those skilled in the art that the details of the electronically controlled tuneable filter, in terms of the type of reactive elements employed, and the method of electronic control utilized, etc., are manners of design choice chosen in accordance with specific applications involved. Furthermore, the techniques involved in harmonic generation, current, and/or voltage control that make up the modulator can vary. Changes, modification and improvements to the above described embodiment of this invention may be made by those skilled in the art without departing from the spirit and scope of the invention.

What is claimed is:

1. An apparatus for eliminating ringing between an input terminal and an output terminal in a stepped frequency format comprising:

a harmonic generator coupled to the input terminal;

a first resonant circuit coupled to the input terminal to receive at least a first and a second frequency from the harmonic generator for selectively resonating at the first frequency and the second frequency, the first resonant circuit having an electric signal influenced variable reactance impedance coupled in parallel with a fixed reactance impedance;

a second resonant circuit coupled to the first resonant circuit for selectively resonating at the second frequency and the first frequency and having an output connected to the output terminal, the second resonant circuit having an electric signal influenced variable reactance impedance coupled in parallel with a fixed reactance impedance;

means for providing an electric signal source at at least two levels;

a switch coupled to the electric signal influenced variable reactance impedance of the first and second resonant circuits and the electric signal providing means for selectively switching between the two levels thereby assuring the alternate selective resonance at the first frequency simultaneously by the first and second resonant circuits and the second frequency simultaneously by the first and second resonant circuits; and a pair of radio frequency chokes each coupling a separate resonant circuit to the electric signal providing means and switch, the electric signal providing means is a potential source and the electric signal influenced variable reactance impedance is a varactor.

2. An apparatus for eliminating ringing between an input terminal and an output terminal in a stepped frequency format comprising:

a harmonic generator coupled to the input terminal;

a first resonant circuit coupled to the input terminal to receive at least a first and a second frequency from the harmonic generator for selectively resonating at the first frequency and the second frequency, the first resonant circuit having an electric signal influenced variable reactance impedance coupled in parallel with a fixed reactance impedance;

a second resonant circuit coupled to the first resonant circuit for selectively resonating at the second frequency and the first frequency and having an output connected to the output terminal, the second resonant circuit having an electric signal influenced variable reactance impedance coupled in parallel with a fixed reactance impedance;

means for providing an electric signal source at at least two levels;

a switch coupled to the electric signal influenced variable reactance impedance of the first and second resonant circuits and the electric signal providing means for selectively switching between the two levels thereby assuring the alternate selective resonance at the first frequency simultaneously by the first and second resonant circuits and the second frequency simultaneously by the first and second resonant circuits; and a pair of radio frequency chokes each coupling a separate resonant circuit to the electric signal providing means and switch, the electric signal providing means is an inductor having a core saturation changing with applied current and the electric signal source means is a current source.

* * * * *